US012348219B2

(12) United States Patent
Wu et al.

(10) Patent No.: US 12,348,219 B2
(45) Date of Patent: Jul. 1, 2025

(54) POWER SUPPLY CIRCUIT MODULE AND POWER SUPPLY JUDGMENT METHOD THEREOF

(71) Applicant: Coretronic Corporation, Hsin-Chu (TW)

(72) Inventors: Yu-Chi Wu, Hsin-Chu (TW); Jeng-An Liao, Hsin-Chu (TW); Wei-Tai Ko, Hsin-Chu (TW)

(73) Assignee: Coretronic Corporation, Hsin-Chu (TW)

( * ) Notice: Subject to any disclaimer, the term of this patent is extended or adjusted under 35 U.S.C. 154(b) by 70 days.

(21) Appl. No.: 18/327,085

(22) Filed: Jun. 1, 2023

(65) Prior Publication Data

US 2023/0412163 A1 Dec. 21, 2023

(30) Foreign Application Priority Data

Jun. 15, 2022 (CN) .......................... 202210676542.5

(51) Int. Cl.
*H03K 17/00* (2006.01)
*G06F 1/26* (2006.01)
*G09G 3/20* (2006.01)
*G09G 5/00* (2006.01)

(52) U.S. Cl.
CPC .............. *H03K 17/00* (2013.01); *G06F 1/26* (2013.01); *G06F 1/266* (2013.01); *G09G 3/2092* (2013.01); *G09G 5/006* (2013.01); *G09G 2330/02* (2013.01)

(58) Field of Classification Search
CPC ....... G06F 1/26; G06F 1/266; G09G 2330/02; G09G 3/2092; G09G 5/006; H03K 17/00
See application file for complete search history.

(56) References Cited

U.S. PATENT DOCUMENTS

| 2009/0189646 | A1* | 7/2009 | Cagno ................. G06F 13/4081 |
| | | | 327/77 |
| 2017/0286360 | A1* | 10/2017 | Srivastava .......... G06F 13/4295 |
| 2020/0174539 | A1* | 6/2020 | Lin ......................... G06F 1/266 |
| 2023/0350839 | A1* | 11/2023 | Han ...................... H02J 7/0063 |
| 2023/0412163 | A1* | 12/2023 | Wu ........................... G06F 1/26 |

FOREIGN PATENT DOCUMENTS

| TW | 201734824 | 10/2017 |
| TW | M577529 | 5/2019 |

* cited by examiner

*Primary Examiner* — Terrell S Johnson
(74) *Attorney, Agent, or Firm* — JCIPRNET

(57) ABSTRACT

A power supply circuit module and a power supply judgment method thereof are provided. A power supply circuit supplies power to an electronic device coupled to the power supply circuit module. A plugging detection circuit detects the connection state of the electronic device. A judgment circuit switches the electronic device to connect to a first signal channel or a second signal channel in response to whether the electronic device provides device information of the electronic device within a preset time since the electronic device is coupled to the power supply circuit module. The power supply judgment method of the invention automatically sets signal channel configurations corresponding to different external devices, thereby greatly improving the convenience of use.

12 Claims, 6 Drawing Sheets

POWER SUPPLY CIRCUIT MODULE AND POWER SUPPLY JUDGMENT METHOD THEREOF

CROSS-REFERENCE TO RELATED APPLICATION

This application claims the priority benefit of China application serial no. 202210676542.5 filed on Jun. 15, 2022. The entirety of the above-mentioned patent application is hereby incorporated by reference herein and made a part of this specification.

BACKGROUND

Technical Field

The disclosure relates to a power supply circuit module, and in particular, relates to a power supply circuit module and a power supply judgment method thereof.

Description of Related Art

Generally, the universal serial bus (USB) port of the projector may be connected to the USB port (D+/D−) of the system-on-chip (SoC) inside the projector and the power supply chip for data transmission. Some external devices (such as Google Chromecast) only require power via the USB port and do not require data transfer. The external device detects whether the USB port (e.g. D+/D− of the USB) is set to a specific configuration. If the USB port (e.g. D+/D− of the USB) is not set to a specific configuration, the external device does not accept the power supply from the projector's USB port and does not work properly.

The information disclosed in this Background section is only for enhancement of understanding of the background of the described technology and therefore it may contain information that does not form the prior art that is already known to a person of ordinary skill in the art. Further, the information disclosed in the Background section does not mean that one or more problems to be resolved by one or more embodiments of the invention was acknowledged by a person of ordinary skill in the art.

SUMMARY

The disclosure provides a power supply circuit module and a power supply judgment method thereof, which automatically set signal channel configurations corresponding to different external devices, thereby greatly improving the convenience of use.

Other objectives and advantages of the disclosure can be further illustrated by the technical features broadly embodied and described as follows.

In order to achieve one of, or portions of, or all of the above objectives or other objectives, a power supply circuit module of the disclosure is disposed in a display device. The power supply circuit module includes a power supply circuit, a plugging detection circuit, and a judgment circuit. The power supply circuit is coupled to the judgment circuit and supplies power to an electronic device coupled to the power supply circuit module. The plugging detection circuit is coupled to the judgment circuit and detects a connection state of the electronic device. The judgment circuit switches the electronic device to connect to a first signal channel or a second signal channel in response to whether the electronic device provides device information of the electronic device within a preset time since the electronic device is coupled to the power supply circuit module.

The disclosure further provides a power supply judgment method for a power supply circuit module. The power supply circuit module is disposed in a display device and configured to supply power to an electronic device coupled to the power supply circuit module. The power supply circuit module includes a power supply circuit, a plugging detection circuit, and a judgment circuit. The judgment circuit is coupled to the power supply circuit and the plugging detection circuit. The power supply judgment method of the power supply circuit module includes: detecting by the plugging detection circuit a connection state of the electronic device with the power supply circuit module, judging by the judgment circuit whether device information of the electronic device is received within a preset time since the electronic device is coupled to the power supply circuit module, and switching the electronic device to connect to a first signal channel or a second signal channel by the judgment circuit in response to whether the electronic device receives the device information of the electronic device within a preset time.

Based on the above, the judgment circuit of the disclosure switches the electronic device to connect to the first signal channel or the second signal channel in response to whether the judgment circuit receives the device information of the electronic device within a preset time, and automatically sets signal channel configurations corresponding to the charging requirements of different electronic devices, which greatly improves the convenience of use.

Other objectives, features and advantages of the present invention will be further understood from the further technological features disclosed by the embodiments of the present invention wherein there are shown and described preferred embodiments of this invention, simply by way of illustration of modes best suited to carry out the invention.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

It is to be understood that other embodiment may be utilized and structural changes may be made without departing from the scope of the invention. Also, it is to be understood that the phraseology and terminology used herein are for the purpose of description and should not be regarded as limiting. The use of "including," "comprising," or "having" and variations thereof herein is meant to encompass the items listed thereafter and equivalents thereof as well as additional items. Unless limited otherwise, the terms "connected," "coupled," and "mounted," and variations thereof herein are used broadly and encompass direct and indirect connections, couplings, and mountings.

Figure 1:
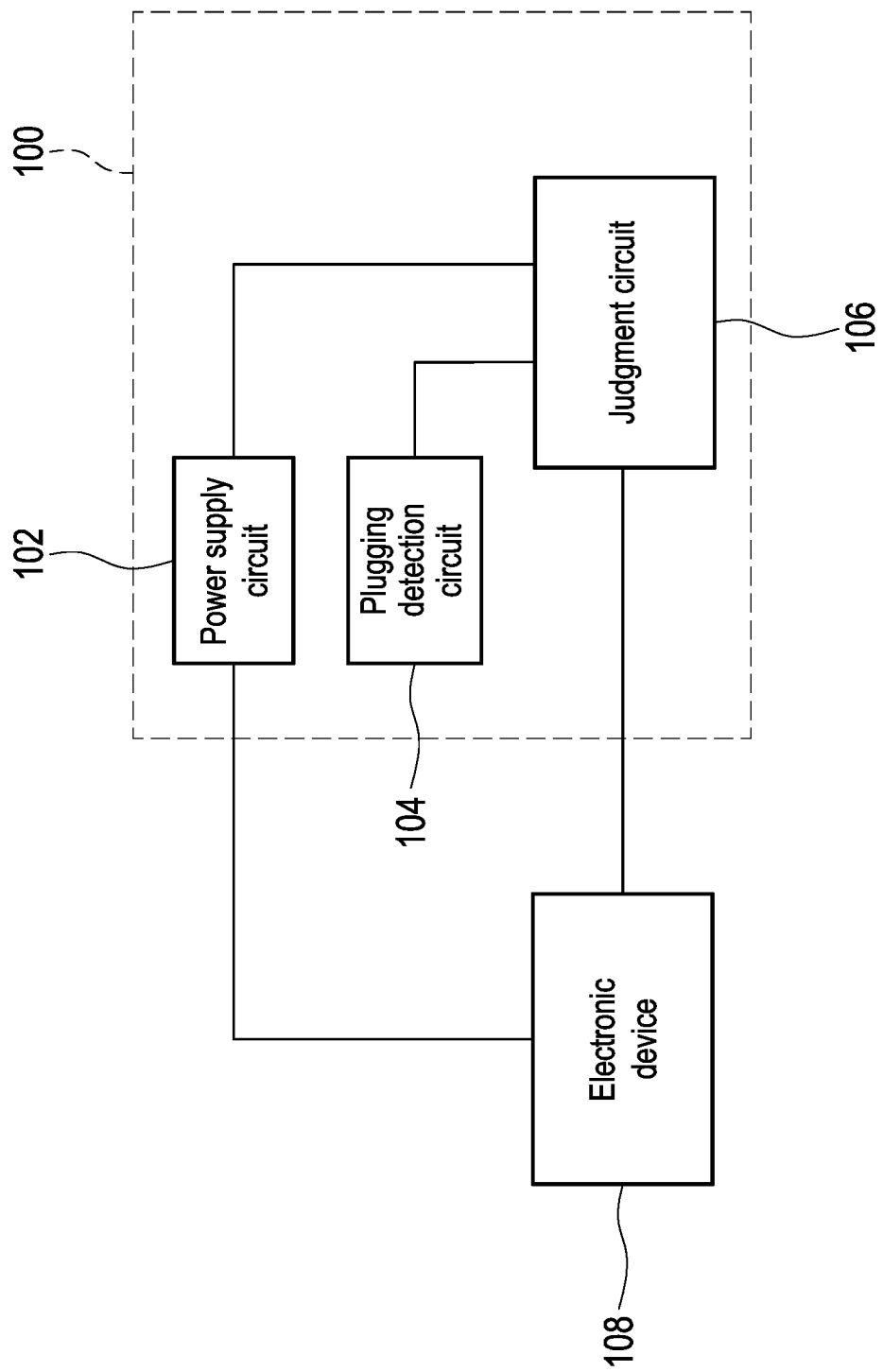
FIG. 1 is a schematic view of a power supply circuit module according to an embodiment of the disclosure.

FIG. 1 is a schematic view of a power supply circuit module according to an embodiment of the disclosure. Referring to FIG. 1, the power supply circuit module 100 may be disposed in a display device, such as a projector or a liquid crystal display, but not limited thereto. The power supply circuit module 100 may include a power supply circuit 102, a plugging detection circuit 104, and a judgment circuit 106. The judgment circuit 106 is coupled to the power supply circuit 102, the plugging detection circuit 104, and the electronic device 108 connected to the display device. The power supply circuit 102 of the power supply circuit module 100 is also coupled to the electronic device 108. Furthermore, the power supply circuit 102 and the judgment circuit 106 of the power supply circuit module 100 may be coupled to the electronic device 108, for example, through a USB interface. The power supply circuit 102 is connected to the electronic device 108 through the power pins of the USB interface. The judgment circuit 106 may be connected to the electronic device 108, for example, through the differential signal pins (D+ and D−) of the USB interface.

The power supply circuit 102 supplies power to the electronic device 108 through the power pins of the USB interface, and the plugging detection circuit 104 detects the connection state between the display device and the electronic device 108. When the electronic device 108 is connected to the power supply circuit module 100, the judgment circuit 106 switches the electronic device 108 to connect to the first signal channel or the second signal channel in response to whether the electronic device 108 provides the device information thereof within a preset time since the electronic device 108 is connected to the power supply circuit module 100. The device information of the electronic device 108 may include, for example, identification information and input operation information of the electronic device 108. For example, when the electronic device 108 is a mouse, a keyboard, or a Wi-Fi USB dongle, the electronic device 108 sends information about the type, the model, the identification code, the specification of the mouse, keyboard, or Wi-Fi USB dongle, the coordinate information of the mouse, the key information of the keyboard, or the network packet information of the Wi-Fi USB dongle, but not limited thereto. The judgment circuit 106 switches the electronic device 108 to connect to the first signal channel or the second signal channel according to whether the electronic device 108 provides the device information thereof within a preset time, so that the signal transmitted by the electronic device 108 is provided to a suitable circuit and power is supplied to the electronic device 108 corresponding to the charging requirement of the electronic device 108. Thus, the convenience of use of the display device using the power supply circuit module 100 is greatly improved.

Figure 2:
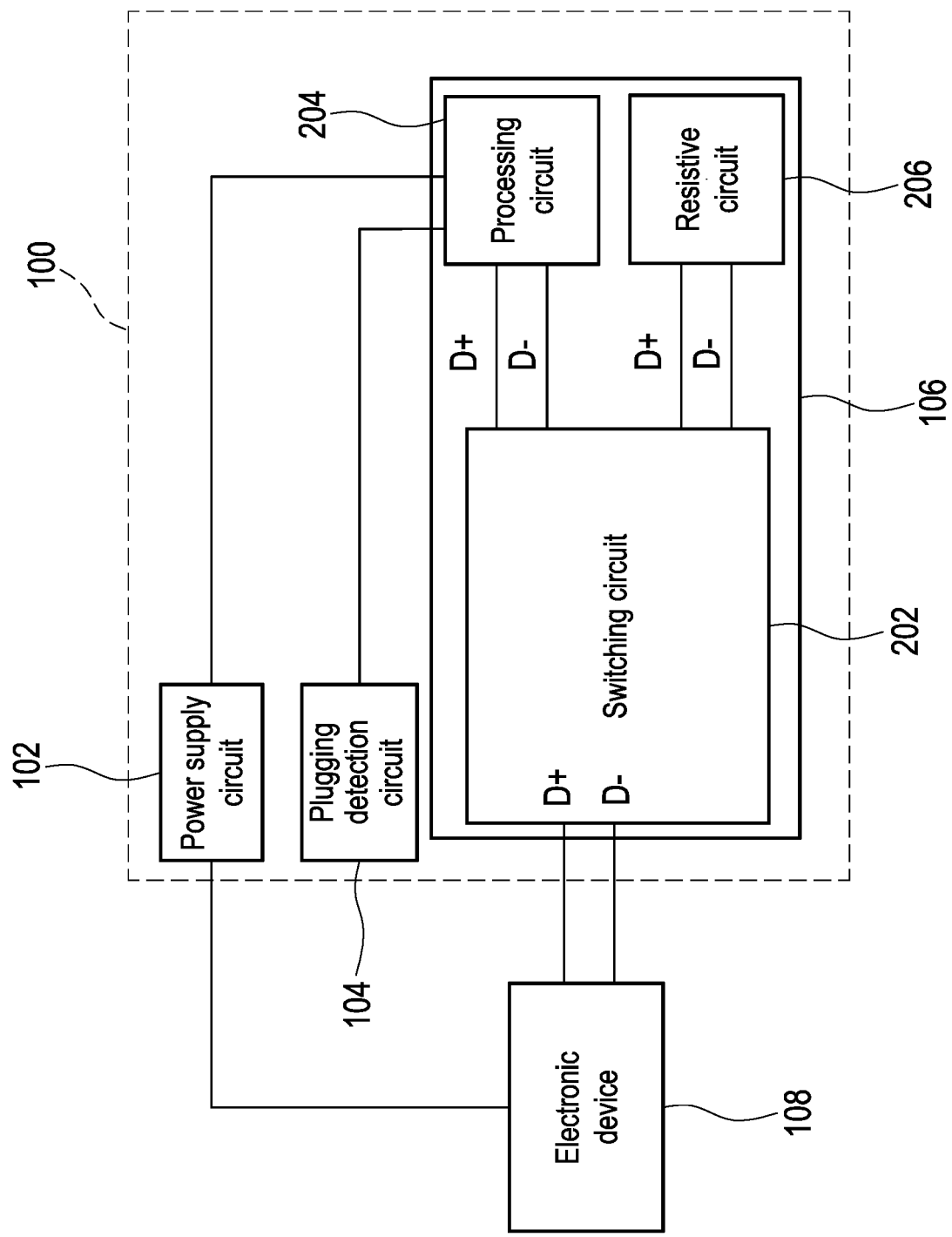
FIG. 2 is a schematic view of a power supply circuit module according to another embodiment of the disclosure.

For example, in the embodiment of FIG. 2, the judgment circuit 106 may include a switching circuit 202, a processing circuit 204, and a resistive circuit 206. The switching circuit 202 is coupled to the processing circuit 204, the resistive circuit 206, and the electronic device 108 inserted into the power supply circuit module 100. The processing circuit 204 is coupled to the power supply circuit 102 and the plugging detection circuit 104. The processing circuit 204 may be, for example, a system-on-chip (SoC), but not limited thereto. In this embodiment, the first signal channel is the signal channel of the switching circuit 202 connected to the processing circuit 204, and the second signal channel is the signal channel of the switching circuit 202 connected to the resistive circuit 206. If the electronic device 108 is not connected to the power supply circuit module 100, the switching circuit 202 is preset to connect the connection ports (differential signal pins D+ and D−) of the USB interface of the power supply circuit module 100 to the first signal channel, that is, connecting to the processing circuit 204, but not limited thereto.

When the electronic device 108 is connected to the power supply circuit module 100, in a case where the electronic device 108 provides device information through the preset first signal channel within the preset time since the electronic device 108 is coupled to the power supply circuit module 100, the processing circuit 204 determines that the electronic device 108 is capable of performing data transmission and controls the switching circuit 202 to keep the electronic device 108 connected to the first signal channel (in the case where the switching circuit 202 is not preset to connect to the first signal channel, the switching circuit 202 switches to connect to the first signal channel), and the electronic device 108 and the processing circuit 204 transmit data. The processing circuit 204 simultaneously controls the power supply circuit 102 to supply power to the electronic device 108 through the power pins of the USB interface.

Figure 3:
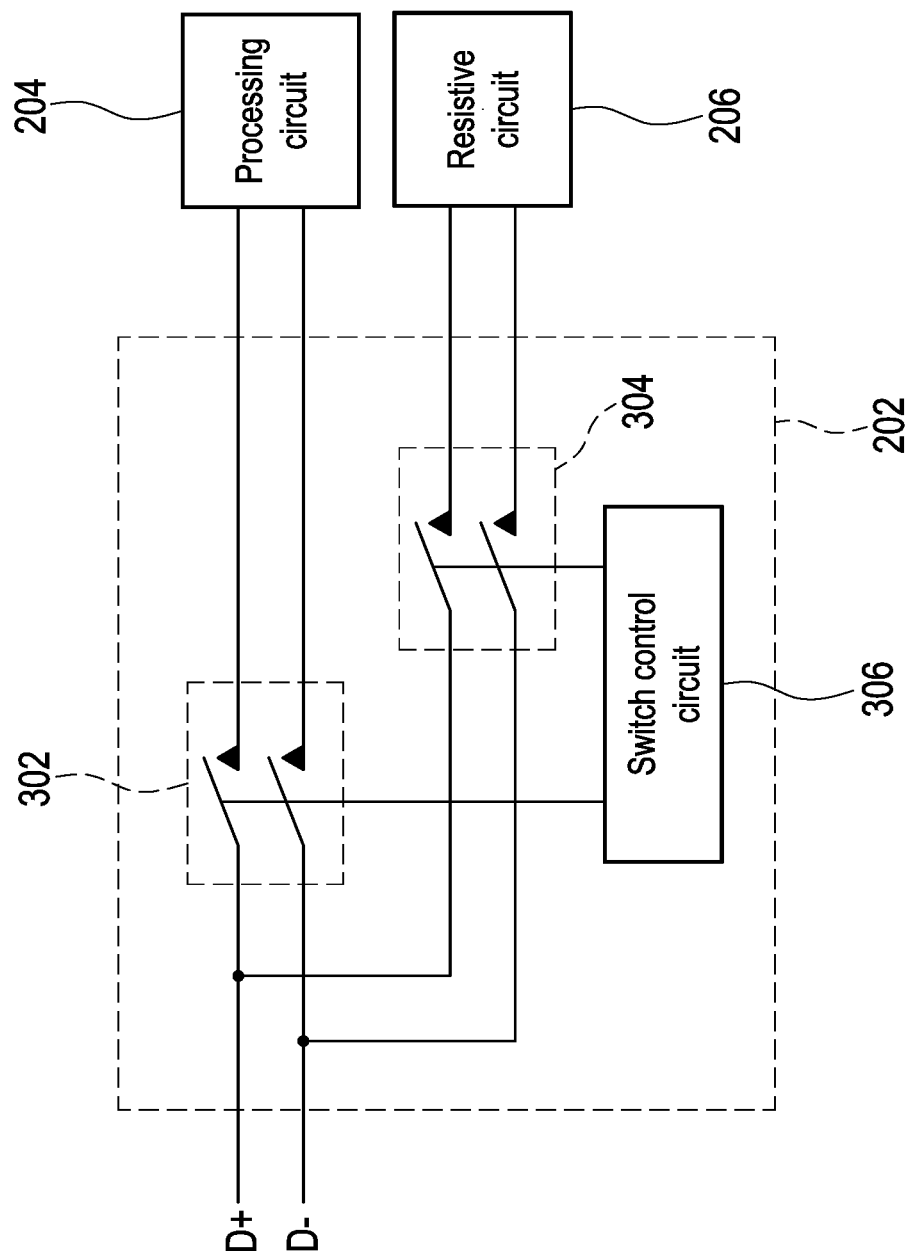
FIG. 3 is a schematic view of a switching circuit according to an embodiment of the disclosure.

Furthermore, the implementation of the switching circuit 202 may be as shown in FIG. 3, including a changeover switch 302, a changeover switch 304, and a switch control circuit 306. The changeover switch 302 is coupled between the connection ports (differential signal pins D+ and D−) of the USB interface of the power supply circuit module 100 and the processing circuit 204. The changeover switch 304 is coupled between the connection ports (differential signal pins D+ and D−) of the USB interface of the power supply circuit module 100 and the resistive circuit 206. The switch control circuit 306 is controlled by the processing circuit 204 to control the conduction states of the changeover switch 302 and changeover switch 304, so that the electronic device 108 connected to the power supply circuit module 100 is connected to the processing circuit 204 through the first signal channel, or connected to the resistive circuit 206 through the second signal channel.

In addition, when the electronic device 108 is connected to the power supply circuit module 100, in a case where the electronic device 108 does not provide device information within the preset time since the electronic device 108 is coupled to the power supply circuit module 100, the processing circuit 204 judges that the electronic device 108 is not capable of processing data transmission. Taking Google Chromecast as an example, it uses the charging specification BC 1.2 (Battery Charging 1.2) and does not require data transmission. Therefore, the power supply circuit module 100 also needs to be correspondingly configured to support the charging specification BC 1.2. The processing circuit 204 controls the switching circuit 202 to switch in response to the electronic device 108 not providing device information within the preset time, so that the electronic device 108 is connected to the resistive circuit 206 through the second signal channel, that is, switched to connect to the resistive circuit 206. Under the charging specification BC 1.2, the electronic device 108 sends a testing signal to the power supply circuit module 100 and judges whether to accept the power supply circuit module 100 for power supply according to the feedback signal provided by the power supply circuit module 100 corresponding to the testing signal. In this embodiment, the resistive circuit 206 provides the feedback signal to the electronic device 108 in response to the testing signal transmitted by the electronic device 108.

Figure 4:
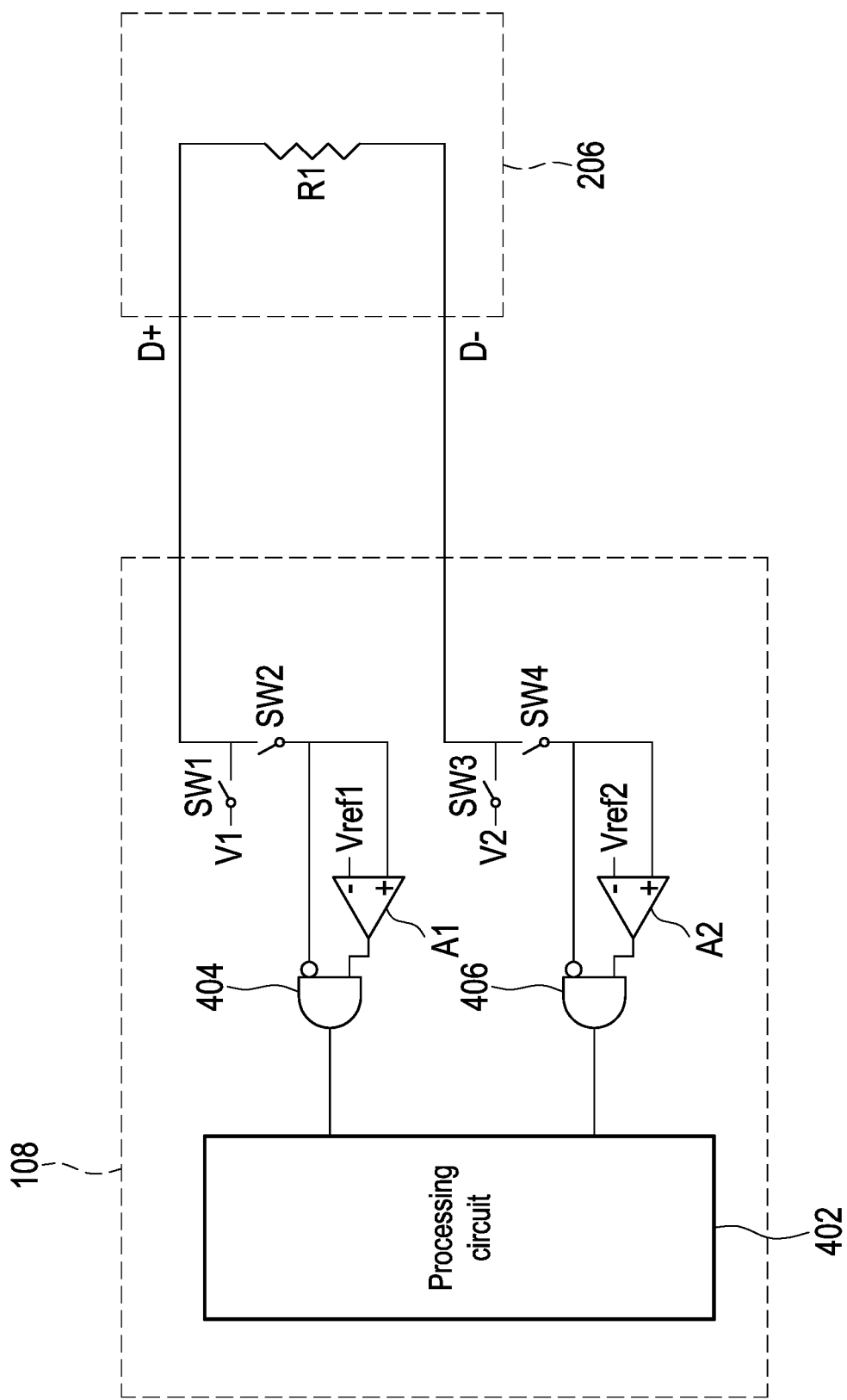
FIG. 4 is a schematic view of an electronic device connected to a resistive circuit according to an embodiment of the disclosure.

Furthermore, the state when the electronic device 108 is switched to connect to the resistive circuit 206 is, for example, as shown in FIG. 4. In this embodiment, the electronic device 108 includes a processing circuit 402, an AND gate circuit 404, an AND gate circuit 406, a comparator A1, a comparator A2, a switch SW1, a switch SW2, a switch SW3, and a switch SW4. The processing circuit 402 is coupled to the output ends of the AND gate circuit 404 and the AND gate circuit 406. The two input ends of the AND gate circuit 404 are respectively coupled to the output end and the positive input end of the comparator A1. The two input ends of the AND gate circuit 406 are respectively coupled to the output end and the positive input end of the comparator A2. The negative input end of the comparator A1 is coupled to a reference voltage Vref1 and the negative input end of the comparator A2 is coupled to a reference voltage Vref2. The switch SW2 is coupled between the positive input end of the comparator A1 and the resistive circuit 206 of the power supply circuit module. The switch SW1 is coupled between a testing voltage V1 and the resistive circuit 206 of the power supply circuit module. The switch SW4 is coupled between the positive input end of the comparator A2 and the resistive circuit 206 of the power supply circuit module. The switch SW3 is coupled between a testing voltage V2 and the resistive circuit 206 of the power supply circuit module. The resistive circuit 206 is implemented by a resistor R1, which is coupled between the switch SW2 and the switch SW4.

When the electronic device 108 is connected to the power supply module 100, the electronic device 108 turns on the switch SW1 and the switch SW4 and turns off the switch SW2 and the switch SW3, thereby providing the testing voltage V1 (testing signal) to the resistive circuit 206 through the positive signal pin D+ (second signal channel). The resistor R1 in the resistive circuit 206 provides a feedback voltage (feedback signal) to the electronic device 108 through the negative signal pin D−(second signal channel) in response to the testing voltage V1. The feedback voltage is transmitted to the processing circuit 402 through the comparator A2 and the AND gate circuit 406. After the processing circuit 402 receives the signal provided by the AND gate circuit 406, the electronic device 108 turns off the switch SW1 and the switch SW4 and turns on the switch SW2 and the switch SW3, thereby providing the testing voltage V2 (testing signal) to the resistive circuit 206 through the negative signal pin D−(second signal channel). The resistor R1 in the resistive circuit 206 provides a feedback voltage (feedback signal) to the electronic device 108 through the positive signal pin D+ (second signal channel) in response to the testing voltage V2. The feedback voltage is transmitted to the processing circuit 402 through the comparator A1 and the AND gate circuit 404.

The processing circuit 402 may judge whether the signals provided by the AND gate circuit 404 and the AND gate circuit 406 are compliant with the charging specification BC 1.2. Under a condition that the signals provided by the AND gate circuit 404 and the AND gate circuit 406 are compliant with the charging specification BC 1.2, the processing circuit 402 judges that the power supply circuit module has a charging downstream port (DCP), and thus accepts the power supply circuit module 100 for power supply. In addition, if the signals provided by the AND gate circuit 404 and the AND gate circuit 406 are not compliant with the charging specification BC 1.2, the processing circuit 402 provides a prompt signal to inform the user that the electronic device 108 cannot accept the power supply circuit module 100 for power supply. For example, the prompt signal for the user may be provided to the display device through the HDMI interface of the display device, so that the display device displays a relevant error message to achieve the purpose of prompting the user.

In addition, since the switching circuit 202 is preset to connect to the first signal channel (processing circuit 204), when the electronic device 108 with no data transmission requirement is connected to the power supply circuit module 100, the electronic device 108 cannot receive the feedback signal from the resistive circuit 206. Therefore, after the processing circuit 204 judges that the electronic device 108 is a device with no data transmission requirement (that is, the electronic device 108 has not provided device information of the electronic device 108 within the preset time), the processing circuit 204 needs to switch the switching circuit 202 to connect to the second signal channel (resistive circuit 206), and controls the power supply circuit 102 to stop supplying power, so that the electronic device 108 transmits the testing signal to the power supply circuit module 100. Since the switching circuit 202 has been switched to connect to the second signal channel when the electronic device 108 transmits the testing signal again, the resistive circuit 206 provides the feedback signal to the electronic device 108 in response to the testing signal transmitted by the electronic device 108, and then restarts the power supply circuit 102 to supply power to the electronic device 108.

In addition, when the plugging detection circuit 104 detects that the electronic device 108 is removed from the power supply circuit module 100, the processing circuit 204 controls the switching circuit 202 to keep the electronic device 108 connected to the first signal channel or switch to connect to the first signal channel, which ensures that when the electronic device 108 is inserted and connected to the power supply circuit module 100 next time, the processing circuit 204 is in a state capable of receiving the device information of the electronic device 108, so as to set the configuration of the power supply circuit module 100 in response to the type of the electronic device 108.

Figure 5:
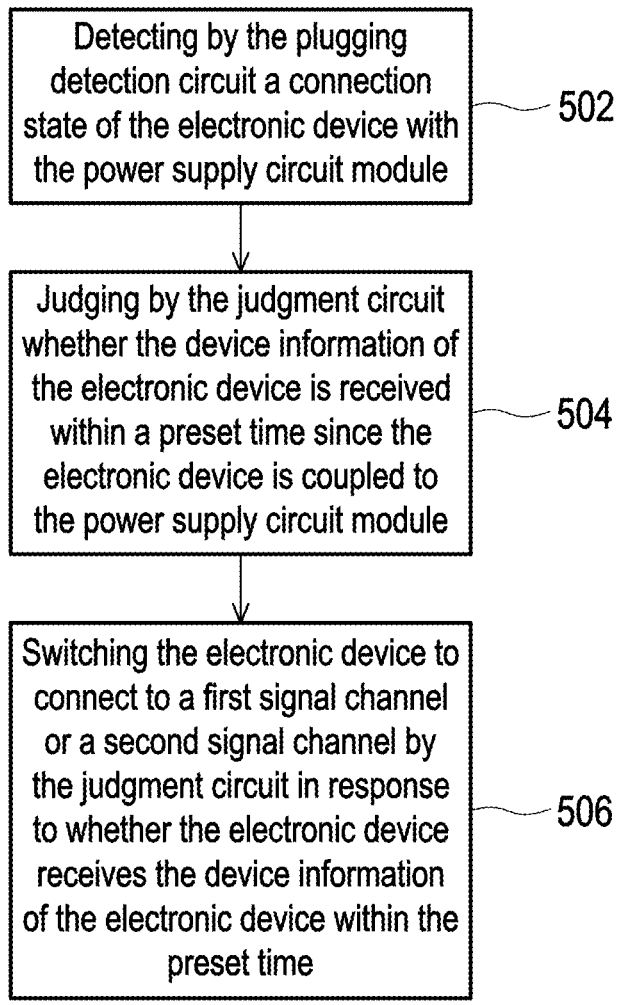
FIG. 5 is a flowchart of a power supply judgment method of a power supply circuit module according to an embodiment of the disclosure.

FIG. 5 is a flowchart of a power supply judgment method of a power supply circuit module according to an embodiment of the disclosure. It can be known from the above embodiments that the power supply judgment method of the power supply circuit module may at least include the following steps. First, the connection state of the electronic device with the power supply circuit module is detected by the plugging detection circuit (Step 502). Next, whether the device information of the electronic device is received within a preset time since the electronic device is coupled to the power supply circuit module is judged by the judgment circuit (Step 504). The device information of the electronic device may include, for example, identification information and input operation information of the electronic device. After that, the electronic device is switched to connect to the first signal channel or the second signal channel by the judgment circuit in response to whether the electronic device receives the device information of the electronic device within the preset time (Step 506). The judgment circuit may include a processing circuit and a resistive circuit. The processing circuit is located on the first signal channel. The resistive circuit is located on the second signal channel. In some embodiments, the first signal channel may be the preset connection channel.

Figure 6:
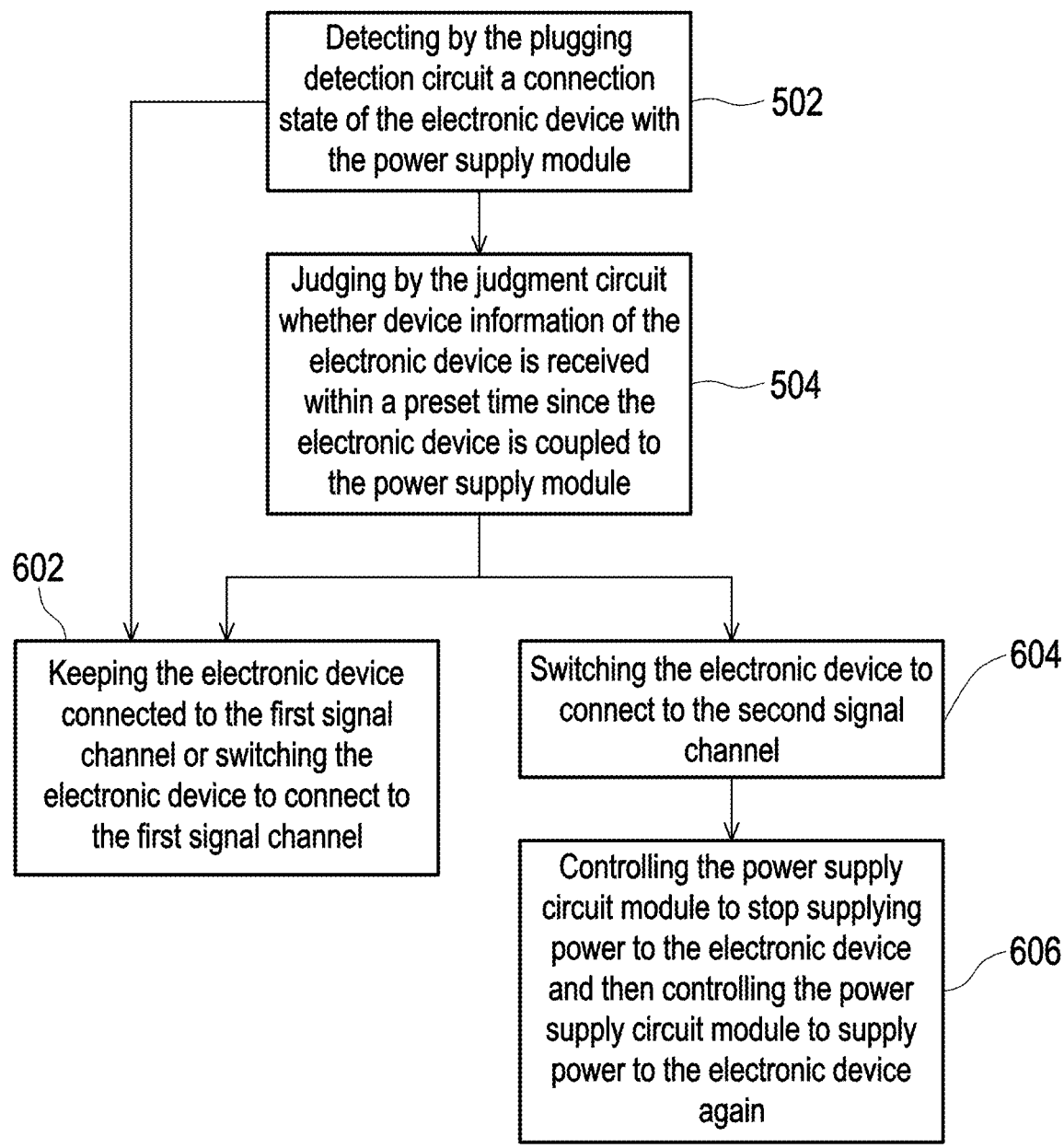
FIG. 6 is a flowchart of a power supply judgment method of a power supply circuit module according to another embodiment of the disclosure.

Furthermore, the power supply judgment method of the power supply circuit module may be as shown in FIG. 6. In Step 504, if the judgment circuit judges that the device information of the electronic device is received within the preset time, the electronic device is switched to connect to the first signal channel or kept connected to the first signal channel (Step 602). If the judgment circuit judges that the device information of the electronic device is not received within the preset time, the electronic device is switched to connect to the second signal channel (Step 604), the power supply circuit module is controlled to stop supplying power to the electronic device, and the power supply circuit module is then controlled to supply power to the electronic device again (Step 606). The processing circuit is configured to judge whether the device information of the electronic device is received within the preset time, and control the switching circuit to switch between the first signal channel and the second signal channel. In addition, the resistive circuit provides a feedback signal in response to the testing signal provided by the electronic device, and the electronic device judges whether to accept the power supply circuit module for power supply according to the feedback signal. In addition, in step 502, if it is detected that the electronic device is removed from the power supply circuit module, the processing may move on to step 602 to keep the electronic device connected to the first signal channel or switch to connect to the first signal channel, which ensures that when the electronic device is inserted and connected to the power supply circuit module next time, the processing circuit located on the first signal channel is in a state capable of receiving the device information of the electronic device. To sum up, the judgment circuit of the disclosure switches the electronic device to connect to the first signal channel or the second signal channel in response to whether the judgment circuit receives the device information of the electronic device within a preset time, thereby automatically setting signal channel configurations corresponding to the charging requirements of different electronic devices without the user's manual setting. The convenience of use is greatly improved.

The foregoing description of the preferred embodiments of the invention has been presented for purposes of illustration and description. It is not intended to be exhaustive or to limit the invention to the precise form or to exemplary embodiments disclosed. Accordingly, the foregoing description should be regarded as illustrative rather than restrictive. Obviously, many modifications and variations will be apparent to practitioners skilled in this art. The embodiments are chosen and described in order to best explain the principles of the invention and its best mode practical application, thereby to enable persons skilled in the art to understand the invention for various embodiments and with various modifications as are suited to the particular use or implementation contemplated. It is intended that the scope of the invention be defined by the claims appended hereto and their equivalents in which all terms are meant in their broadest reasonable sense unless otherwise indicated. Therefore, the term "the invention", "the disclosure" or the like does not necessarily limit the claim scope to a specific embodiment, and the reference to particularly preferred exemplary embodiments of the invention does not imply a limitation on the invention, and no such limitation is to be inferred. The invention is limited only by the spirit and scope of the appended claims. Moreover, these claims may refer to use "first", "second", etc. following with noun or element. Such terms should be understood as a nomenclature and should not be construed as giving the limitation on the number of the elements modified by such nomenclature unless specific number has been given. The abstract of the disclosure is provided to comply with the rules requiring an abstract, which will allow a searcher to quickly ascertain the subject matter of the technical disclosure of any patent issued from this disclosure. It is submitted with the understanding that it will not be used to interpret or limit the scope or meaning of the claims. Any advantages and benefits described may not apply to all embodiments of the invention. It should be appreciated that variations may be made in the embodiments described by persons skilled in the art without departing from the scope of the disclosure as defined by the following claims. Moreover, no element and component in the present disclosure is intended to be dedicated to the public regardless of whether the element or component is explicitly recited in the following claims.

What is claimed is:

1. A power supply circuit module disposed in a display device, the power supply circuit module comprising a power supply circuit, a plugging detection circuit, a judgment circuit, a power pin, and two differential signal pins,
    wherein the power supply circuit is coupled to the judgment circuit and is configured to be coupled to an electronic device through the power pin for supplying power to the electronic device;
    wherein the plugging detection circuit is coupled to the judgment circuit and is configured to detect a connection state of the electronic device; and
    wherein the judgment circuit is configured to be coupled to the electronic device through the differential signal pins, and in response to whether the judgment circuit receives a device information of the electronic device provided from the electronic device within a preset time since the electronic device is coupled to the power supply circuit module, the judgment circuit switches between a first signal channel and a second signal channel, so as to connect the electronic device to the first signal channel of the judgment circuit or the second signal channel of the judgment circuit through the differential signal pins.

2. The power supply circuit module according to claim 1, wherein the judgment circuit comprises:
    a switching circuit configured to switch optionally between the first signal channel and the second signal channel;
    a resistive circuit coupled to the switching circuit and located on the second signal channel; and
    a processing circuit coupled to the plugging detection circuit and the switching circuit and located on the first signal channel, wherein a preset connection channel of the switching circuit is the first signal channel, and in response to the judgment circuit receiving the device information of the electronic device provided by the electronic device within the preset time, the processing circuit controls the switching circuit to switch to the first signal channel or keep connecting to the first signal channel, while in response to the judgment circuit not receiving the device information of the electronic device provided by the electronic device within the preset time, the processing circuit controls the switching circuit to switch to the second signal channel.

3. The power supply circuit module according to claim 2, wherein the resistive circuit provides a feedback signal in response to a testing signal provided by the electronic device, and the electronic device judges whether to accept the power supply circuit module for power supply according to the feedback signal.

4. The power supply circuit module according to claim 2, wherein in response to the judgement circuit not receiving the device information of the electronic device provided by the electronic device within the preset time, the processing circuit further controls the power supply circuit to stop supplying power to the electronic device, and then controls the power supply circuit to supply power to the electronic device again.

5. The power supply circuit module according to claim 2, wherein in response to the plugging detection circuit detecting that the electronic device is removed from the power supply circuit module, the processing circuit controls the switching circuit to keep the judgment circuit in the first signal channel or switch to the first signal channel.

6. The power supply circuit module according to claim 1, wherein the device information of the electronic device comprises identification information and input operation information of the electronic device.

7. A power supply judgment method of a power supply circuit module, wherein the power supply circuit module is disposed in a display device, wherein the power supply circuit module comprises a power supply circuit configured to be coupled to an electronic device through a power pin, a plugging detection circuit, and a judgment circuit configured to be coupled to the electronic device through two differential signal pins, and wherein the judgment circuit is coupled to the power supply circuit and the plugging detection circuit, the power supply judgment method of the power supply circuit module comprising:
   detecting by the plugging detection circuit a connection state of the electronic device with the power supply circuit module;
   judging by the judgment circuit whether a device information of the electronic device is received within a preset time since the electronic device is coupled to the power supply circuit module; and in response to whether the judgment circuit receives the device information of the electronic device provided by the electronic device within the preset time, switching between a first signal channel and a second signal channel correspondingly by the judgment circuit, so as to connect the electronic device to the first signal channel of the judgment circuit or the second signal channel of the judgment circuit through the differential signal pins.

8. The power supply judgment method of the power supply circuit module according to claim 7, wherein the judgment circuit comprises a processing circuit and a resistive circuit, the processing circuit is located on the first signal channel, the resistive circuit is located on the second signal channel, and the first signal channel is a preset connection channel, wherein the power supply judgment method of the power supply circuit module comprises:
   controlling to switch to connecting to the first signal channel or controlling to keep connecting to the first signal channel by the processing circuit in response to the judgment circuit receiving the device information of the electronic device provided by the electronic device within the preset time; and
   controlling to switch to the second signal channel by the processing circuit in response to the judgment circuit not receiving the device information of the electronic device provided by the electronic device within the preset time, wherein the processing circuit is configured to judge whether the device information of the electronic device is received within the preset time and control switching between the first signal channel and the second signal channel.

9. The power supply judgment method of the power supply circuit module according to claim 8, comprising:
   providing a feedback signal by the resistive circuit in response to a testing signal provided by the electronic device, wherein the electronic device judges whether to accept the power supply circuit module for power supply according to the feedback signal.

10. The power supply judgment method of the power supply circuit module according to claim 7, further comprising:
   controlling the power supply circuit to stop supplying power to the electronic device and then controlling the power supply circuit to supply power to the electronic device again by the judgment circuit in response to the judgement circuit not receiving the device information of the electronic device provided from the electronic device within the preset time.

11. The power supply judgment method of the power supply circuit module according to claim 7, comprising:
   keeping the judgment circuit to the first signal channel or switching to the first signal channel by the judgment circuit in response to detecting that the electronic device is removed from the power supply circuit module.

12. The power supply judgment method of the power supply circuit module according to claim 7, wherein the device information of the electronic device comprises identification information and input operation information of the electronic device.

* * * * *